United States Patent [19]

Robinson et al.

[11] Patent Number: 5,075,254
[45] Date of Patent: Dec. 24, 1991

[54] METHOD AND APPARATUS FOR REDUCING DIE STRESS

[75] Inventors: Murray J. Robinson, Mountain View; Ywan-Lung Tsay, San Jose, both of Calif.

[73] Assignee: National Semiconductor Corporation, Santa Clara, Calif.

[21] Appl. No.: 553,123

[22] Filed: Jul. 13, 1990

Related U.S. Application Data

[62] Division of Ser. No. 186,445, Apr. 26, 1988, Pat. No. 4,952,999.

[51] Int. Cl.⁵ .............................................. H01L 21/48
[52] U.S. Cl. .................................... 437/209; 437/220; 437/902
[58] Field of Search .............. 437/209, 220, DIG. 902

[56] References Cited

U.S. PATENT DOCUMENTS 4,211,354 7/1980 Hoffman et al. ..................... 228/118

FOREIGN PATENT DOCUMENTS 0137859 1/1987 Japan .

Primary Examiner—Olik Chaudhuri
Assistant Examiner—Ourmazd S. Ojan
Attorney, Agent, or Firm—Flehr, Hohbach, Test, Albritton & Herbert

[57] ABSTRACT

A slotted metallic die attach pad is disclosed for attachment of a semiconductor die, such as a silicon die, to form a die assembly demonstrating significantly reduced die attach stress. A plurality of substantially parallel, unidirectional slots in the die attach pad permits deformation of the die attach pad at the slots to compensate for differences in the thermal expansion coefficients of the silicon die and the metallic die attach pad. Stress sensitive components of the die are aligned in a stress sensitive direction, and the die is bonded on the die attach pad so that the stress sensitive direction is generally orthongonal to the longitudinal axes of the slots. A method for relieving die stress in a die assembly is also disclosed.

1 Claim, 1 Drawing Sheet

METHOD AND APPARATUS FOR REDUCING DIE STRESS

This is a division of application Ser. No. 186,445 filed 4-26-88 now U.S. Pat. No. 4,952,999.

TECHNICAL FIELD

The present invention relates generally to a method and apparatus for reducing die stress in a semiconductor die assembly including a die bonded to a metallic die attach pad. The invention relates more specifically to a method and apparatus for reducing die stress in linear semiconductor devices which results from differential thermal expansion properties of a silicon die and a metallic die attach pad.

BACKGROUND ART

It is known that differences in thermal properties of the die and the metallic die attach pad may produce large stresses, particularly in a silicon die after attachment to the die attach pad. These stresses may significantly affect the electrical properties of the silicon die, and die stress contributes to substantial yield and reliability problems, particularly in linear semiconductor devices.

A conventional die attach process requires bonding of a silicon die, for example, to a metallic die attach pad with a polyimide bonding agent. The bonded die assembly must be subjected to elevated temperatures for several hours to properly cure the bonding agent and provide good adhesion between the silicon die and the die attach pad. Upon cooling of the bonded die assembly to ambient operating temperatures, differences in the thermal properties of the silicon die and the metallic die attach pad produce stresses in the die. Linear semiconductor devices are especially sensitive to small die stress shifts on the order of about 5% and less, since small die stress shifts produce substantial alterations in electrical properties, particularly resistance. The die stress from a standard polyimide die attach process may introduce shifts of up to 10% in circuit parameters, which poses serious yield and reliability problems. Since the stress shift is usually non-uniform over the die, devices on different parts of the die will also not track one another in their changes. Significant lack of precision in the relative operating parameters of the devices thus results, in addition to the overall shift in parameters induced by stresses.

Problems relating to bonding materials having different thermal properties have been addressed in a variety of applications. U.S. Pat. No. 3,284,176 teaches brazing waffle-like grooved surfaces of a metallic member to a metallized ceramic surface to overcome thermal stresses caused by differential coefficients of thermal expansion of the ceramic and the metallic member. Thermal stresses are presumed to be relieved in the transitional area between the tops of the grooved surfaces and the main body of the metallic member. U.S. Pat. No. 4,211,354 teaches a method for alleviating stress damage in metallic matrix composites by positively introducing discontinuities at the interface between the layers to reduce thermal stress produced by unequal thermal expansion of the layers. The '354 patent teaches drilling holes or forming grooves in a grid pattern in the metallic matrix layer to provide a discontinuous bond at the interface between the layers.

One approach specific to reducing die stress resulting from differences in thermal properties of the silicon die and the metallic die attach pad is to reduce adhesion between the die and the die attach pad. This approach has been unsatisfactory, however, since reduced adhesion results in reduced reliability of the die assembly. Modifications to the structure of the die attach pad have also been proposed for a variety of purposes. For example, U.S. Pat. No. 4,445,271 teaches a perforated ground pad in the form of a grid bonded to a ceramic substrate and connected to a support by means of tabs. The ground pad is provided with perforations for passage of gases which may form during bonding of the surface of the ground pad to the ceramic surface. U.S. Pat. No. 4,451,973 teaches a plastic encapsulated semiconductor device and leadframe therefor wherein the substrate support of the leadframe may be provided with a three-dimensional patterned surface to increase the surface area of contact between the substrate support and plastic encapsulation material. The three-dimensional patterned surface of the leadframe also increases adherence and heat dissipation.

None of the prior methods and apparatus has satisfactorily overcome the problems related to die stresses caused by differential thermal coefficients of expansion of the silicon die and the metallic die attach pad while maintaining good adhesion and shear strength of the die assembly.

Accordingly, it is an objective of the present invention to provide method and apparatus for reducing die stress in a die assembly resulting from differential thermal properties of the silicon die and the metallic die attach pad.

It is another objective of the present invention to maintain good adhesion and shear strength in a die assembly including a die bonded to a metallic die attach pad, while reducing die stress caused by differential thermal properties of the die and the die attach pad.

It is yet another objective of the present invention to provide a die attach pad which permits the die to contract during the die attach process by deforming the die attach pad to relieve die stress in the bonded die assembly.

DISCLOSURE OF THE INVENTION

According to the present invention, a plurality of parallel slots in the form of longitudinal openings is provided in the metallic die attach pad. The slots in the die attach pad reduce the stress on the die by permitting the die to contract and deform the die attach pad during and after the die attach process. The slots provided in the die attach pad are preferably unidirectional and narrow to provide a large surface area for adhesion of the die and the die attach pad. Because only a small amount of die attach pad material is removed during formation of the narrow slots, the thermal dissipation and strength of the die attach bond is unaffected.

The applicants' experimental results indicate that grooves in a die attach pad which do not form openings through the pad do not provide satisfactory die stress relief, since they do not permit sufficient deformation of the die attach pad during and after the die attach process. The applicants' experiments likewise indicated that a die attach pad having an array of small openings arranged in a honeycomb-like pattern likewise provided unsatisfactory stress relief and furthermore resulted in reduced adhesion and shear strength of the die assembly. Provision of bi-directional slot in the die attach pad also did not materially reduce die stress in the bonded die assembly.

According to a preferred embodiment of the present invention, parallel, unidirectional slots are equidistantly spaced in the die attach pad, and stress-sensitive components of a silicon die are aligned generally orthogonal to the longitudinal axes of the die attach pad slots during attachment of the silicon die to the die attach pad. Since most stress sensitive die include shallow implanted devices, they can generally be designed so that only one direction is stress sensitive. Conventional die attach procedures and bonding agents may be utilized to attach the die to the slotted die attach pad of the present invention after proper alignment of the stress-sensitive direction of the die with respect to the longitudinal axes of the die attach pad slots.

BRIEF DESCRIPTION OF THE DRAWINGS

The above-mentioned and additional features of the present invention and the manner of obtaining them will become apparent, and the invention will be best understood by reference to the following more detailed description read in conjunction with accompanying schematic drawings, in which.

BEST MODE OF CARRYING OUT THE INVENTION

Figure 1A:
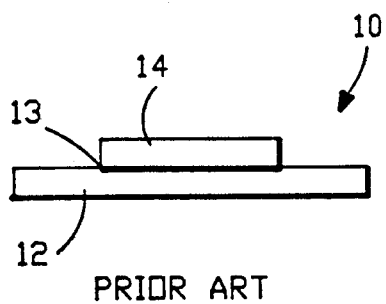
FIG. 1A shows an enlarged side view of a prior art die assembly including a silicon die bonded to a metallic die attach pad before cooling of the bonded die assembly to ambient operating temperatures.
Figure 1B:
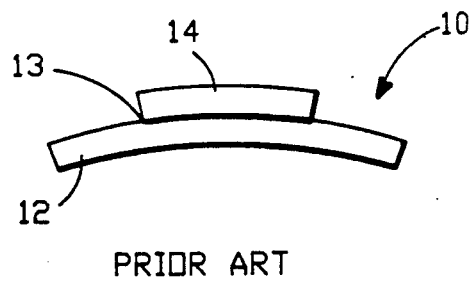
FIG. 1B shows an enlarged side view of a prior art die assembly including a silicon die bonded to a metallic die attach pad after curing of the bonding agent and cooling of the bonded die assembly to ambient operating temperatures.

FIG. 1A shows a conventional, prior art die assembly 10, including metallic die attach pad 12 bonded to silicon die 14 by means of a conventional bonding agent 13, such as a polyimide binding agent. FIG. 1A illustrates the relationship of the die and the die attach pad after application of the bonding agent, but before cooling the bonded die assembly to ambient operating temperatures. FIG. 1B shows prior art die assembly 10 after curing the bonding agent at elevated temperatures and cooling the die assembly to ambient operating temperatures. The thermal expansion coefficient mismatch between silicon die 14 and metallic die attach pad 12 generally results in bending of the die assembly, as shown, and produces large stresses in silicon die 14. Die stress may significantly affect electrical properties of the die assembly, and may result in significant yield and reliability problems particularly in linear integrated circuits, such as BIFET integrated circuits wherein junction field effect transistors (JFETs) are implanted on the same chip with standard bipolar transistors, resistors, and the like.

Figure 2:
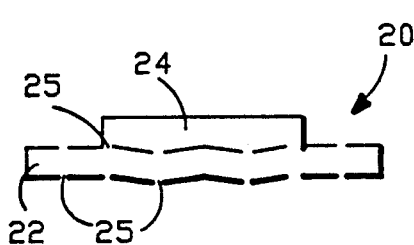
FIG. 2 shows an enlarged side view of the die assembly of the present invention including a silicon die bonded to a metallic die attach pad after curing of the bonding agent and cooling of the bonded die assembly to ambient operating temperatures.

FIG. 2 illustrates the die assembly of the present invention, after curing the bonding agent and cooling the die assembly to ambient operating temperatures. Die assembly 20 includes slotted metallic die attach pad 22 bonded to die 24, such as a silicon die, by means of a conventional bonding agent 23, such as a polyimide. The relationship of the die and the die attach pad of the present invention after application of the bonding agent, but before cooling to ambient operating temperatures is substantially as shown in FIG. 1A. Due to the provision of a plurality of slots 25 in metallic die attach pad 22, however, deformation of the die attach pad occurs during cooling of the bonded die assembly to compensate for the differential thermal expansion coefficients of the silicon die and the metallic die attach pad. Deformation of the die attach pad in this manner provides good adhesion between the die and the die attach pad, and the assembled die demonstrates good shear strength.

Figure 3:
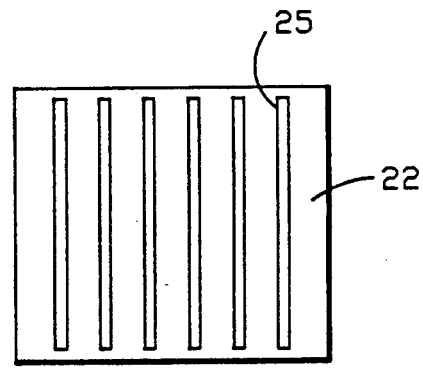
FIG. 3 shows an enlarged top view of the slotted die attach pad of the present invention.

FIG. 3 illustrates an enlarged top view of the slotted die attach pad of the present invention. As used herein, the term "slot" indicates a longitudinal opening penetrating the entire thickness of the die attach pad material, as distinguished from a groove or the like which does not penetrate the entire thickness of the material. According to a preferred embodiment of the slotted die attach pad of the present invention, slots 25 are parallel, unidirectional, and equidistantly spaced from one another. The slots preferably extend for at least about 40% of the length (or width) of the die attach pad. Die attach pad 22 preferably comprises a conventional metallic die attach pad provided with about three to about twelve spaced slots, and most preferably provided with about four to about nine spaced slots.

Slots may be provided in the die attach pad by means which are known in the art, such as by etching, stamping, drilling, or the like. Slots 25 are preferably as narrow as may be practically fabricated, since it is desired to remove as little die attach pad material as possible to maintain good adhesion between the die and the die attach pad and good shear strength of the die assembly. Slots 25 are preferably from about 0.5 to about 20 mils (thousandths of an inch) wide and most preferably from about 2 to about 15 mils wide for most die assembly applications. Slots 25 are preferably spaced about 5 to about 40 mils apart, and most preferably from about 10 to about 25 mils apart.

Figure 4:
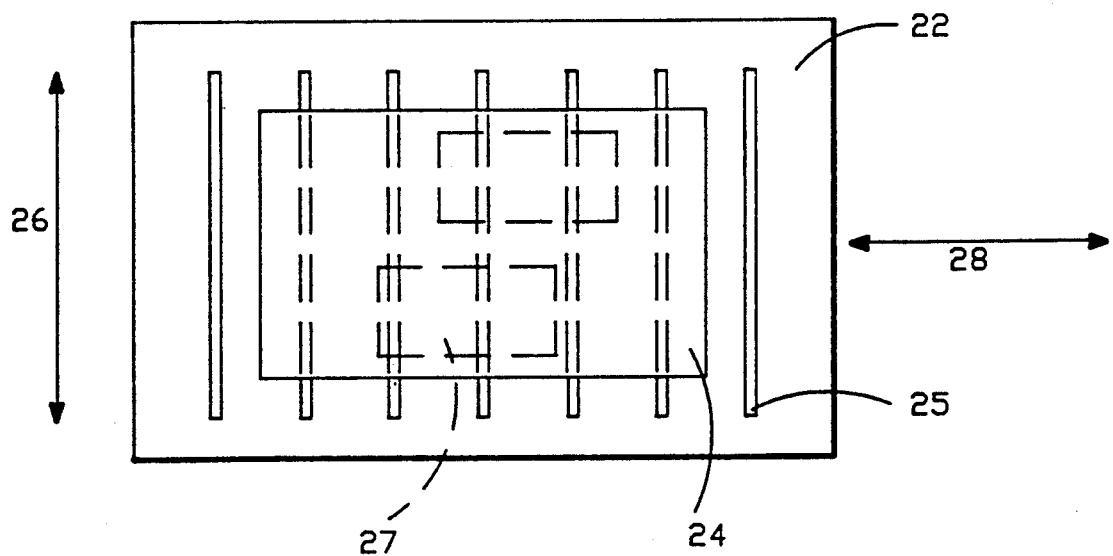
FIG. 4 shows an enlarged top view of the slotted die attach pad of FIG. 3 with a silicon die having stress sensitive components embedded therein bonded to the die attach pad.

FIG. 4 schematically illustrates die assembly 20 of the present invention comprising silicon die 24 bonded on slotted metallic die attach pad 22. Silicon die 24 includes at least one stress sensitive component 27 generally aligned in stress sensitive direction 28. Die 24 is arranged on slotted metallic die attach pad 22 so that stress sensitive direction 28 of die 24 is generally orthogonal to the longitudinal axes 26 of slots 25. Since most stress sensitive die include shallow implanted devices such as BIFET devices and resistors, they may generally be designed so that only one direction is stress sensitive. According to a preferred embodiment of the die assembly of the present invention, the stress sensitive direction of the die is arranged within about 30 degrees, and preferably within about 15 degrees, from orthogonal to longitudinal axes 26 of slots 25 in the die attach pad.

The method of the present invention relates to relieving die stress in a die assembly including a silicon die bonded to a metallic die attach pad. The metallic die attach pad is provided with a plurality of parallel unidirectional slots to permit deformation of the die attach pad during cooling of the die assembly to ambient operating temperatures. According to a preferred embodiment of the method of the present invention, stress sensitive components in the die are generally aligned in a stress sensitive direction, and the die is then arranged on the slotted die attach pad with the stress sensitive direction of the die generally orthogonal to the longitudinal axes of the slots in the die attach pad. The method of the present invention significantly reduces die attach stress in a die assembly including a die having stress sensitive components bonded to a metallic die attach pad.

The compositions, dimensions, and other characteristics and parameters of suitable dies and stress sensitive components thereof, and suitable die attach pads, have not been specifically described, since these features are well known in the art. The apparatus and method of the present invention are applicable to many types of die assemblies having dies, and particularly silicon dies, bonded to metallic die attach pads. The apparatus and method of the present invention is particularly suitable for use with dies having stress sensitive components formed therein.

The following Example sets forth a specific embodiment of the present invention for the purpose of more fully understanding the present invention, and is not intended to limit the invention in any way.

EXAMPLE

Stress on a silicon die can usually be observed by the change in resistance of an implanted resistor, which is approximately proportional to the change in die stress. To demonstrate that use of the slotted die attach pad of the present invention significantly reduces die stress, the following tests were conducted.

Test dies having dimensions of about 122×121 mil with an array of multiple implanted resistors aligned generally in a stress sensitive direction were used for testing purposes. Three different groups of die attach pads were used: (1) a control group wherein the die attach pads had an uninterrupted, planar surface; (2) a first group wherein the die attach pads were provided with slots oriented in a direction transverse to the length of the die attach pad; and (3) a second group wherein the die attach pads were provided with slots oriented in a direction parallel to the length of the die attach pad. Each of the dice in the first and second groups was provided with 10 parallel slots. The slot width was approximately 1.5 mil, and the space between adjacent slots was approximately 25 mil.

The resistance of implanted resistors was measured prior to bonding each die to a die attach pad. The die was then attached to a die attach pad by means of a standard polyimide die attach process using poly 6 bonding agent. After application of the bonding agent, the die assembly was cured at 175° C. for 3 hours and thereafter subjected to ambient temperatures until the die assembly was cooled to ambient temperature. A first sample including each group of die attach pads represented die assemblies wherein the implanted resistors were aligned generally parallel to the slots and a second sample including each group of die attach pads represented die assemblies wherein the implanted resistors were aligned generally orthogonal to the slots. After the die assemblies had cooled to ambient temperatures, the resistance of implanted resistors was measured. The percentage change in resistance measured before and after the die attach process was calculated and is shown in the following table:

| Die Attach Pads | Orientation of Resistor | |
|---|---|---|
| | Parallel to Slots | Orthogonal to Slots |
| Control group (without slots) | 2.6% | 2.7% |
| First group (with slots) | 2.6% | 0.28% |
| Second group (with slots) | 2.2% | 0.85% |

The applicants' experimental results demonstrate that provision of slots in the die attach pad and orientation of stress sensitive components generally orthogonal to the direction of the slots significantly reduces die stress in the bonded die assembly. Die shear strength was also measured using die shear test procedures according to mil spec 883C. The results of these tests indicated that there was no measurable difference in shear strength of die assemblies having die attach pads in each of the three above-mentioned groups.

While in the foregoing specification this invention has been described in relation to certain preferred embodiments thereof, and many details have been set forth for purposes of illustration, it will be apparent to those skilled in the art that the invention is susceptible to additional embodiments and that certain of the details described herein can be varied considerably without departing from the basic principles of the invention.

What is claimed is:

1. A method for relieving die stress in a die assembly including a semiconductor die bonded to a metallic die attach pad, the method comprising:

providing a plurality of substantially parallel, unidirectional slots in the metallic die attach pad extending from a top surface of the metallic die attach pad through to a bottom surface of the metallic die attach pad, the semiconductor die having stress-sensitive components formed in the semiconductor die;

aligning the stress sensitive components of the semiconductor die generally in a stress-sensitive direction;

orienting the semiconductor die on the metallic die attach pad so that the stress sensitive direction of the semiconductor die is generally orthogonal with respect to the longitudinal axes of the slots;

applying a bonding agent to the semiconductor die and the metallic die attach pad;

heating the bonding agent to an elevated temperature to bond the semiconductor die to the metallic die attach pad to form the die assembly; and allowing the die assembly to cool to ambient temperature while allowing the metallic die attach pad to deform at the slots to compensate for differences in thermal properties of the semiconductor die and the metallic die attach pad.

* * * * *